United States Patent
Hong

(10) Patent No.: US 10,943,645 B2
(45) Date of Patent: Mar. 9, 2021

(54) MEMORY DEVICE WITH A BOOSTER WORD LINE

(71) Applicant: Taiwan Semiconductor Manufacturing Company, Ltd., Hsinchu (TW)

(72) Inventor: Hyunsung Hong, Hsinchu (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 0 days.

(21) Appl. No.: 16/515,503

(22) Filed: Jul. 18, 2019

(65) Prior Publication Data

US 2020/0043547 A1 Feb. 6, 2020

Related U.S. Application Data

(60) Provisional application No. 62/712,733, filed on Jul. 31, 2018.

(51) Int. Cl.
| | |
|---|---|
| *G11C 11/418* | (2006.01) |
| *G11C 11/412* | (2006.01) |
| *H01L 23/528* | (2006.01) |
| *H01L 27/11* | (2006.01) |
| *G11C 5/06* | (2006.01) |
| *G11C 8/08* | (2006.01) |
| *G11C 11/417* | (2006.01) |
| *G11C 11/419* | (2006.01) |
| *G11C 5/02* | (2006.01) |
| *G11C 8/14* | (2006.01) |
| *G11C 11/413* | (2006.01) |

(52) U.S. Cl.
CPC .......... *G11C 11/418* (2013.01); *G11C 5/025* (2013.01); *G11C 5/063* (2013.01); *G11C 8/08* (2013.01); *G11C 8/14* (2013.01); *G11C 11/412* (2013.01); *G11C 11/413* (2013.01); *G11C 11/417* (2013.01); *G11C 11/419* (2013.01); *H01L 23/528* (2013.01); *H01L 27/1104* (2013.01)

(58) Field of Classification Search
CPC ... G11C 11/418; G11C 11/412; G11C 11/413; H01L 23/528; H01L 27/1104
See application file for complete search history.

(56) References Cited

U.S. PATENT DOCUMENTS

2006/0268651 A1* 11/2006 Cutter ................. G11C 8/08
365/230.06
2008/0273403 A1* 11/2008 Ehrenreich ...... G11C 29/50012
365/194

(Continued)

*Primary Examiner* — Mushfique Siddique
(74) *Attorney, Agent, or Firm* — Merchant & Gould P.C.

(57) ABSTRACT

A semiconductor device is provided. The semiconductor includes a plurality of memory cells arranged in rows and columns. The device further includes a plurality of primary word lines, each being connected to a first plurality of memory cells arranged in a row and a plurality of bit line pairs, each being connected to a second plurality of memory cells arranged in a column. The device further includes a word line driver circuit operative to select a first primary word line of the plurality of primary word lines and charge the selected first primary word line from a first end and a secondary word line operative to charge the selected first primary word line from a second end.

20 Claims, 11 Drawing Sheets

(56) References Cited

U.S. PATENT DOCUMENTS

| | | | |
|---|---|---|---|
| 2010/0214859 A1* | 8/2010 | Behrends | G11C 11/413 365/203 |
| 2014/0112061 A1* | 4/2014 | Jung | G11C 11/418 365/154 |
| 2017/0076785 A1* | 3/2017 | Ishii | G11C 11/418 |
| 2019/0221256 A1* | 7/2019 | Kumar | H01L 27/1104 |

* cited by examiner

MEMORY DEVICE WITH A BOOSTER WORD LINE

PRIORITY CLAIM AND CROSS-REFERENCE

This application claims priority to U.S. Provisional Patent Application No. 62/712,733 titled "SRAM with Word Line Booster" filed Jul. 31, 2018, the disclosure of which is hereby incorporated by reference in its entirety.

BACKGROUND

A common type of integrated circuit memory is a static random access memory (SRAM) device. An SRAM device includes an array of memory cells. Each memory cell uses a predetermined number of transistors connected between an upper reference potential and a lower reference potential such that one of two storage nodes are occupied by the information to be stored, with the complementary information stored at the other storage node. In one example, an SRAM memory cell arrangement includes six transistors. Each bit in the SRAM cell is stored on four of the six transistors, which transistors form cross-coupled inverters. The remaining two transistors are connected to a word line which controls access to the memory cell during read and write operations by selectively connecting the memory cell to bit lines.

As memory structures get smaller, the metal dimensions of the word line also get smaller. The small dimensions of the word lines result in an undesirable voltage profile which degrades performance of the memory cell. Moreover, as the memory structure and word lines get smaller, there is no space for simply increasing the metal word line structure. In addition, word line resistance increases as the word lines get smaller, thereby impacting performance of the SRAM device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
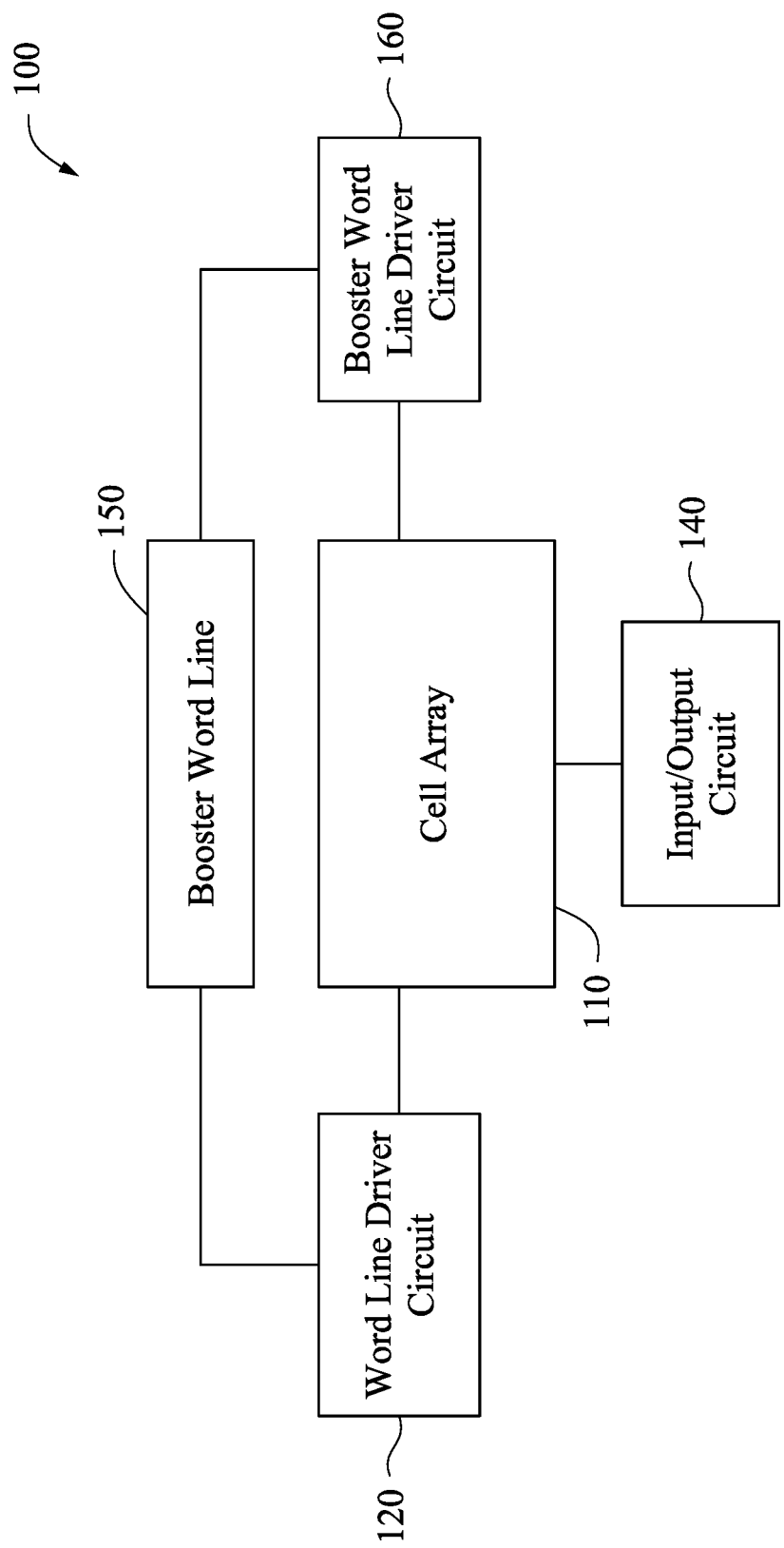
FIG. 1 illustrates a schematic diagram of an example memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some disclosed examples, a memory device with additional word lines is provided. More specifically, a static random access memory (SRAM) device with additional metal lines to improve the word line voltage profile is provided. The additional metal lines, also referred to as booster word lines or secondary word lines, increase the performance of the memory device. For example, the additional word lines provide a better cycle time and a better clock to output time for the memory device. The additional word lines improve a voltage profile of the word lines of cell array 302, which in turn improves a time gap between providing an input and receiving a corresponding output from cell array 302.

In example embodiments, the booster word lines are thicker and wider than the existing word lines. Therefore, a resistance value of the booster word lines is less than the resistance value of the existing word lines. In some embodiments, the booster word lines are formed from a different metal type than that of the existing word lines. In other embodiments, the booster word lines are formed in a different layer than the existing word lines. For example, the booster word lines are formed in a second layer which is different than that of a first layer which includes the existing word lines. For example, the existing word lines are formed in metal layer 1, while the booster word lines are formed in another metal layer, such as the metal layer 2 or metal layer 3.

FIG. 1 illustrates an example of a memory device 100 in accordance with some embodiments. As shown in FIG. 1, memory device 100 includes a cell array 110. Cell array 110 includes a plurality of memory cells (also referred to as bitcells) arranged in a matrix of rows and columns. Each of the plurality of memory cells is operative to store one bit of information. In addition, each cell of cell array 110 is connected to a word line and a bit line pair. An example cell array 110 is illustrated in and described with respect to FIG. 2 of the disclosure.

Memory device 100 further includes a word line driver circuit 120. Word line driver circuit 120 is operative to select a word line of cell array 110 and activate or charge the selected word line to logic high. The logic high is approximately equal to a first predefined potential. In example embodiments, word line driver circuit 120 is a decoder circuit which includes a plurality of logic operators to decode potentials on address lines to identify a word line to charge or activate. The address lines are charged to logic high (that is, approximately equal to the first predefined potential) or logic low (that is, approximately equal to a second predefined potential). In example embodiments, the second predefined potential is approximately equal to the ground potential or zero volt. However, other suitable logic low voltages may be employed. The logic high is represented by bit 1 and the logic low is represented by bit 0. In example embodiments, after selecting a word line, word line driver circuit 120 is operative to charge the selected word line from a first end of the selected word line.

The number of address lines used in word line driver circuit 120 is determined based on a total number of word lines in cell array 110. For example, k address lines are used for $2^k$ word lines. That is, one address line is used when cell array 110 includes up to two word lines, two address lines are used when cell array 110 includes three to four word lines, three bit lines are used for when cell array 110 includes five to eight word lines, and so on.

Memory device 100 includes an input/output circuit 140. Input/output circuit 140 is operative to read and write data into memory cells 110. For example, input/output circuit 140 is operative to sense potentials at the plurality of bit line pairs and compare the potentials for each pair. In example embodiments, when the potential of a first bit line is more than the potential of a second bit line of a bit line pair, input/output circuit 140 reads the output to be logic 1. In addition, when the potential of a first bit line is less than the potential of the second bit line of the bit line pair, input/output circuit 140 reads the output to be logic 0.

Memory device 100 further includes one or more booster word lines 150. Each booster word line 150 is associated with one or more word lines. For example, one booster word line 150 can be associated a predetermined number of word lines. As will be discussed further below, some examples use word line addresses expressed as binary numbers. For ease of expressing booster word lines associated with the predetermined number of word lines, some examples associate $2^n$ word lines with each booster word line (n is a positive integer). Accordingly each booster word line may be associated with $2^1$ (two) word lines, $2^2$ (four) word lines, $2^3$ (eight) word lines, etc. Hence, cell array 110 can be associated with multiple booster word lines 150. Although booster word line 150 is shown separate from cell array 110, it will be apparent to a person of ordinary skill in the art after reading this disclosure that booster word line 150 may be part of cell array 110.

Memory device 100 further includes a booster word line driver circuit 160. Booster world line driver circuit 160 is operative to boost the potential of the selected word line via booster word line 150. For example, booster word line driver circuit 160 is operative to boost the potential of the selected word line by charging the selected word line from a second end of the selected word line. Booster word line driver circuit 160 includes a plurality of logic operators to decode potentials at booster word line 150 and one or more address lines. Although shown as two separate circuits, it will be apparent to person of ordinary skill in the art after reading this disclosure that word line driver circuit 120 and booster word line driver circuit 150 can be combined into a single circuit.

Figure 2:
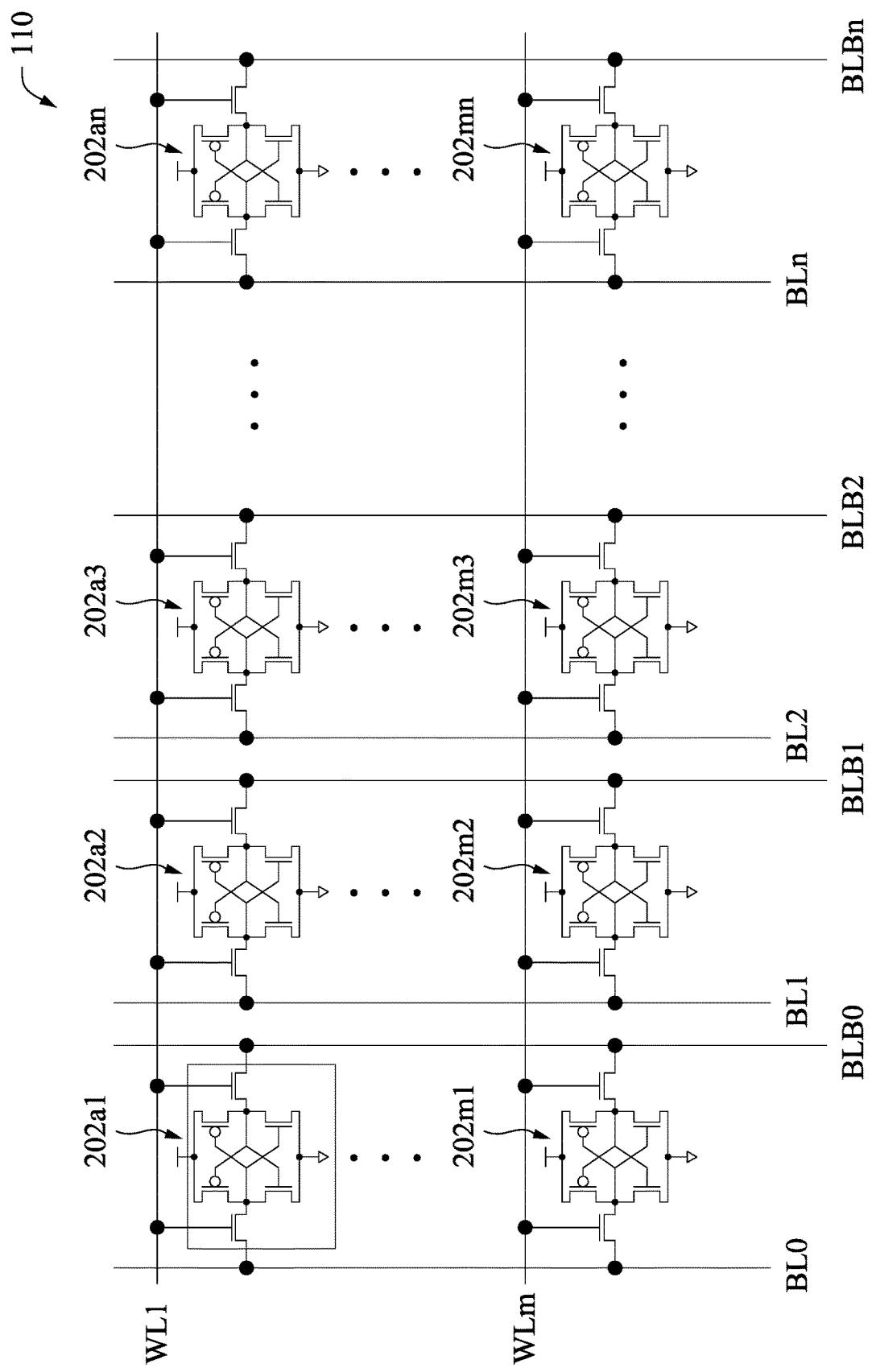
FIG. 2 illustrates a schematic diagram of an example SRAM cell array, in accordance with some embodiments.

FIG. 2 illustrates an example cell array 110. As shown in FIG. 2, cell array 110 includes a plurality of memory cells 202a1, 202a2, . . . , 202nm (collectively referred to as plurality of memory cells 202). Each cell of cell array 110 is operable to store one bit (that is 0 or 1) of information. An example cell 202 includes a pair of cross-coupled invertors (also referred to as Q and Q-bar, where Q-bar is complementary to Q) to store the one bit of information. The cross-coupled inverters are connected to pair of access transistors which grant access to the information stored in the cross-coupled invertors. In example embodiments, although plurality of memory cells 202 of cell array 110 are shown to include four transistors, it will be apparent to person with ordinary skill in the art after reading this disclosure that each of plurality of memory cells 202 can include different number of transistors. For example, each of plurality of memory cells 202 can include six transistors, eight transistors, ten transistors, eleven transistors, twelve transistors, etc. In addition, each of plurality of memory cells 202 of cell array 110 can be a single port cell or a multi-port (such as, two port and three port) cell.

As shown in FIG. 2, plurality of memory cells 202 of cell array 110 are arranged in a matrix of m rows and n columns. Each of the rows and columns of cell array 110 includes a predetermined number of memory cells. For example, a first row includes memory cells 202a1, 202a2, 202a3, . . . , and 202an. The memory cell in the next row may be designated 202b1, and each row may continue to the $m^{th}$ row of cell array 110 where the memory cells may be designated 202m1, 202m2, 202m3, . . . , and 202mn. Each memory cell of the first row is connected to a first word line WL<1>. Similarly, each memory cell of $m^{th}$ row is connected to a $m^{th}$ word line WL<m>. Word lines control access to the respective cells. For example, first word line WL<1> controls access to cells 202a1, 202a2, 202a3, . . . , and 202an. That is, to read or write data to cells 202a1, 202a2, 202a3, . . . , and 202an, first word line WL<1> is activated or charged to logic 1. To hold data in cells 202a1, 202a2, 202a3, . . . , and 202an, first word line WL<1> is de-activated or charged to logic 0.

In addition, and as shown in FIG. 2, memory cells in each column are connected to a bit line pair. For example, memory cells of a first column (that is, 202a1, . . . , 202m1) are connected to bit lines BL<0> and BLB<0>. Similarly, memory cells of a second column (that is, 202a2, . . . , 202m2) are connected to bit lines BL<1> and BLB<1>. In addition, cells of a third column (that is, 202a3, . . . , 202m3) are connected to bit lines BL2 and BLB2. Moreover, cells of an nth column (that is, 202an, . . . , 202mn) are connected to bit lines BLn and BLBn. In example embodiments, bit line BLBn is a complementary to bit line BLn. The bit line pairs are used for reading or writing data to memory cell 202.

The word lines are connected to gates of the pair of access transistors of plurality of memory cells 202. Therefore, when a word line is activated and charged to logic 1 (that is, charged to the first potential), the respective memory cell(s) 202 is connected to one bit line of the of the bit line pair. Memory cell(s) 202 is then accessed by comparing potentials between bit lines of the bit line pair. While a static random access memory device is shown in FIG. 2, other types of memory devices are within the contemplated scope of the invention.

Figure 3A:
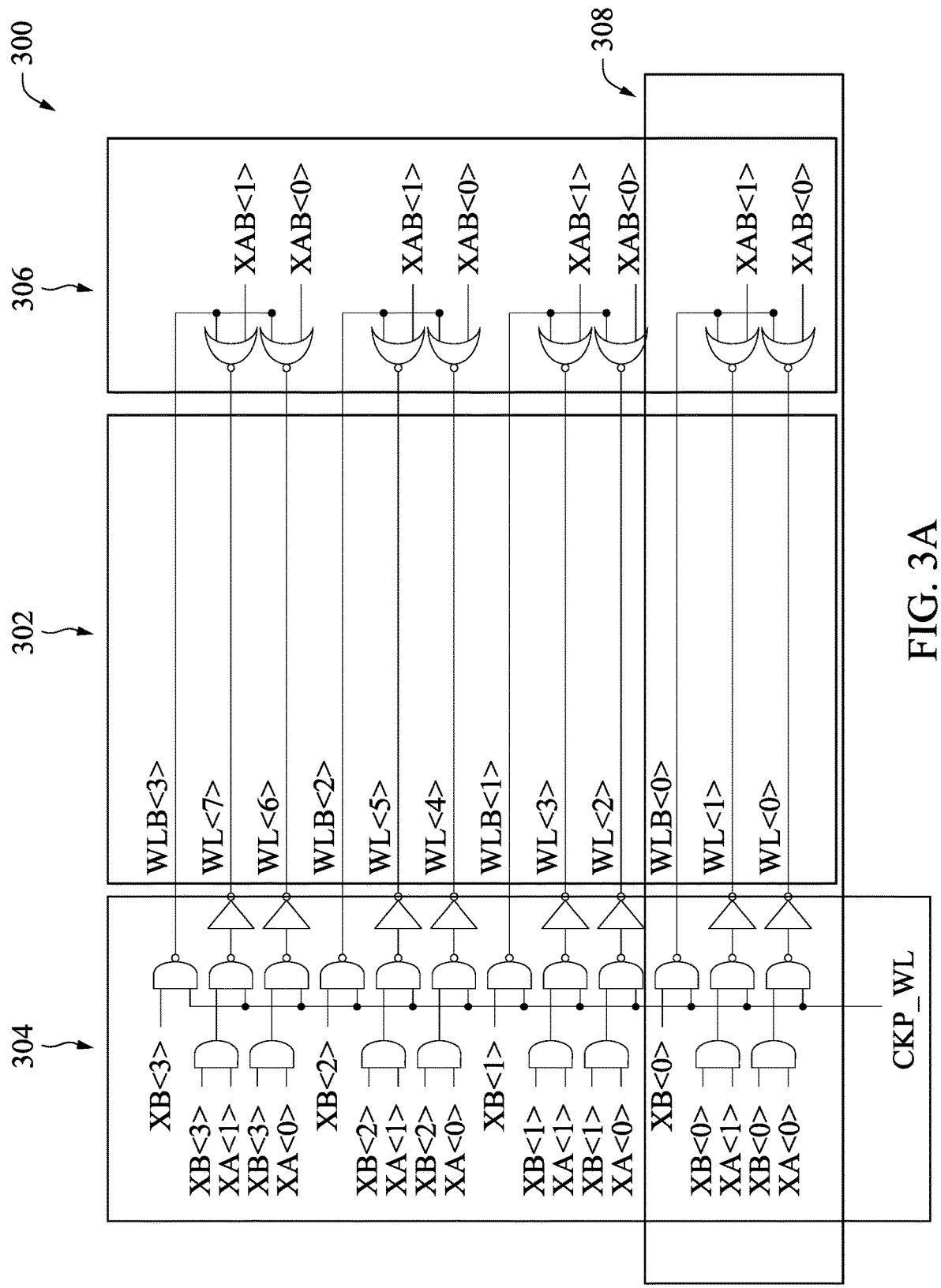
FIG. 3A illustrates a schematic diagram of an example first memory device, in accordance with some embodiments.

FIG. 3A illustrates an example first memory device 300 in accordance to the embodiments of the disclosure. In example embodiments, first memory device 300 is an illustrative example of memory device 100 of FIG. 1. First memory device 300 includes cell array 302. Cell array 302 includes word lines WL<0>, WL<1>, WL<2>, WL<3>, WL<4>, WL<5>, WL<6>, and WL<7>, (also referred to as WL<n>). Each word lines WL<0>, WL<1>, WL<2>, WL<3>, WL<4>, WL<5>, WL<6>, and WL<7> is connected to memory cells (such as plurality of memory cells 202). Although, cell array 302 is shown to include only eight word lines, it will be apparent to a person of skill in the art after reading this disclosure that cell array 302 may include more than or less than eight word lines. For example, cell array 302 can include 16, 32, 128, or 256 word lines. In example embodiments, cell array 302 is an illustrative example of cell array 110 of FIG. 1 and FIG. 2 having eight word lines (that is m=8).

In addition, cell array 302 includes a plurality of booster word lines WLB<O>, WLB<1>, WLB<2>, and WLB<3>. In example embodiments, booster word lines WLB<O>, WLB<1>, WLB<2>, and WLB<3> are metal strips having a predetermined length and a predetermined width. In example embodiments, the booster word lines WLB<0>, WLB<1>, WLB<2>, and WLB<3> are illustrative examples of booster word line 150 of FIG. 1. Each of the booster word lines of cell array 302 is associated with a pair of word lines. For example, booster word line WLB<0> is associated with word lines WL<0> and WL<1>. Similarly, booster word line WLB<1> is associated with word lines WL<2> and WL<3>, booster word line WLB<2> is associated with word lines WL<4> and WL<5>, and booster word line WLB<3> is associated with word lines WL<6> and WL<7>. The configuration where one booster word line is provided for (or associated with) each pair of word lines may be referred to as a 2:1 configuration. An example of a combination of a pair of word lines and an associated booster word line forming a 2:1 configuration is designated as a unit block at 308. In example embodiments, unit block 308 can be replicated to expand the size of cell array 302.

Cell array 302 is accessed using word line driver circuit 304. For example, word line driver circuit 304 is operative to select a word line of cell array 302 and charge the selected word line to logic high. In addition, word line driver circuit 304 is operative to charge a booster word line associated with the selected word line to a pre-decoding address. Word line driver circuit 304 is operative to charge the selected word line from a first end of the selected word line. In example embodiments, word line driver circuit 304 is an illustrative example of word line driver circuit 120 of FIG. 1.

Word line driver circuit 304 includes three address lines to operate cell array 302. Each of the three address lines is charged either to logic high or logic low, thereby providing eight unique selection options (that is, 000, 001, 010, 011, 100, 101, 110, and 111). Word line driver circuit 304 includes a decoding circuit comprising a plurality of logic operators to decode the potentials on the address lines to select a word line of cell array 302. The logic operators are configured to select only one word line for each unique combination of the potentials at the address lines. For example, and as shown in FIG. 3A, word line driver circuit 304 includes a decoding circuit having a plurality of AND logic operators, NAND logic operators, and NOT logic operators. However, it will be apparent to a person with ordinary skill in the art after reading this disclosure that other types of logic operators may be used to implement the decoding circuit of word line driver circuit 304.

Example first memory device 300 further includes a booster word line driver circuit 306. In example embodiments, booster word line driver circuit 306 is an illustrative example of booster word line driver circuit 160 of FIG. 1. Booster word line driver circuit 306 is operative to decode the potentials of the booster word line associated with the selected word line and booster address lines. For example, and as shown in FIG. 3A, word lines and booster address lines are connected to inputs of booster word line driver circuit 306. Based on the decoding, booster word line driver circuit 306 is operative to charge the selected word line from a second end of the selected word line, which is opposite to the first end of the selected word line. For the 2:1 configuration, booster word line driver circuit 306 may use two booster decoding address lines (also referred to as the pre-decoded booster address lines) to charge the selected word line from the opposite end of the selected word line.

For example, and as shown in block 308 of FIG. 3A, booster word line driver circuit 306 includes a plurality of NOR logic operators. The associated booster word line is connected to one input of the NOR logic operators and a booster decoding address line is connected to the other input of the NOR logic operators. The outputs of the NOR logic operators are connected to the second end of the word lines. Therefore, when the potentials of both the associated booster word line and the booster decoding address line are at logic low, the output of the NOR logic operator is logic high, thereby charging the selected word line from the second end. Although, booster word line driver circuit 306 is shown to include a plurality of NOR logic operators, it will be apparent to a person with ordinary skill in the art after reading this disclosure that other type of logic operators may be used to implement the function of booster word line driver circuit 306.

In example embodiments, word line driver circuit 304, instead of decoding potentials of the address lines, is operative to decode potentials of pre-decoded address lines to select a word line of memory device 300. For example, and as shown in FIG. 3A, the word line driver circuit 304 is operative to decode potentials of pre-decoded address lines XB<0>, XB<1>,XB<2>, XB<3>, XA<O>, XA<1>, XAB<O>, and XAB<1> to select a word line of memory device 300. In example embodiments, the pre-decoded address lines XB<O>, XB<1>, XB<2>, XB<3>, XA<O>, and XA<1>, and pre-decoded booster address lines XAB<0> and XAB<1> are obtained from pre decoding the address lines A<0>, A<1>, and A<2> shown in FIG. 3B and discussed below.

Figure 3B:
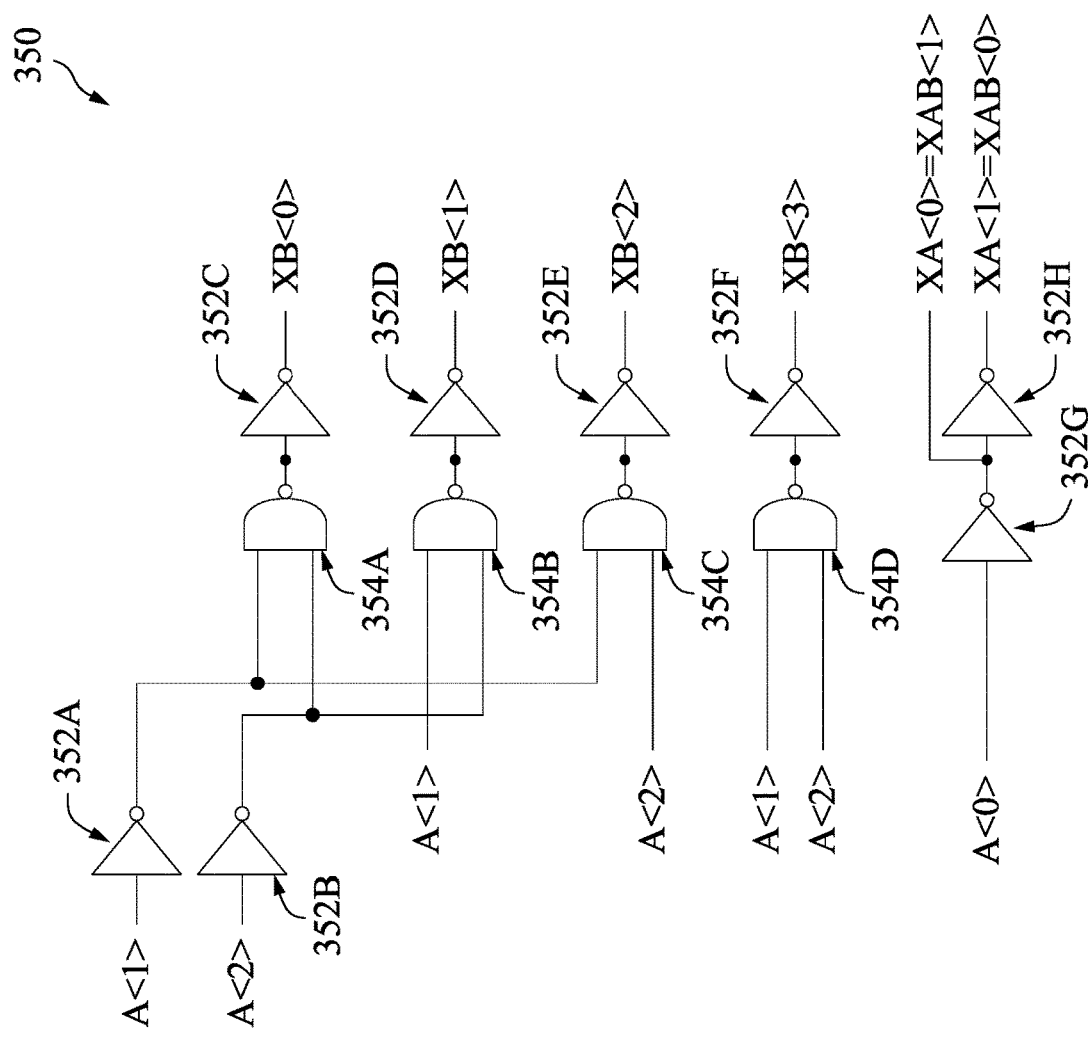
FIG. 3B illustrates a schematic diagram of an example pre-decoding circuit, in accordance with some embodiments.

FIG. 3B shows an example pre-decoding circuit 350 for pre-decoding address lines A<0>, A<1>, and A<2>. As shown in FIG. 3B, pre-decoding circuit 350 decodes two of the three address lines (that is, A<1> and A<2>) into four pre-decoded address lines (that is, XB<0>, XB<1>, XB<2>, and XB<3>). Similarly, pre-decoding circuit 350 pre-decodes the remaining third address line (that is, A<0>) into pre-decoded address lines XA<0> and XA<1>. In addition, the remaining third address line A<0> is pre-decoded into two pre-decoded booster address lines (that is, XAB<0> and XAB<1>). In example embodiments, the pre-decoded booster address line XAB<0> is complementary to the pre-decoded address line XA<1> and pre-decoded booster address line XAB<1> is complimentary to the pre-decoded address line XA<0>.

Although, pre-decoding circuit 350 is shown to decode address lines A<1> and A<2> into pre-decoded address lines XB<0>, XB<1>, XB<2>, and XB<3>, it will be apparent to a person with ordinary skill in the art after reading this disclosure that any two of the three address lines A<0>, A<1>, and A<2> can be pre-decoded into the pre-decoded address lines XB<0>, XB<1>, XB<2>, and XB<3>, and the remaining third address line can be pre-decoded into pre-decoded address lines XA<0> and XA<1> or pre-decoded booster address lines XAB<0> and XAB<1>.

Returning to FIG. 3B, pre-decoding circuit 350 includes a plurality of logic operators, for example, a plurality of NOT logic operators 352A, 352B, 352C, 352D, 352E, 352F, 352G, and 352H (collectively referred to as plurality of NOT logic operators 352) and a plurality of NAND logic operators 354A, 354B, 354C, and 354D (collectively referred to as plurality of NAND logic operators 354). Although pre-decoding circuit 350 is shown to be formed of NOT logic operators and NAND logic operators, it will be apparent to a person with ordinary skill in the art after reading this disclosure that pre-decoding circuit 350 can be formed using other types of logical operators.

The first address line A<1> is connected to the inputs of each of first NOT logic operator 352A, second NAND logic operator 354B, and fourth NAND logic operator 354D. The second address line A<2> is connected to the inputs of each of second NOT logic operator 352B, third NAND logic operator 354C, and fourth NAND logic operator 354D.

The output of first NOT logic operator 352A is connected to the input of each of first NAND logic operator 354A and third NAND logic operator 354C. The output of second NOT logic operator 352B is connected to the input of each of first NAND logic operator 354A and second NAND logic operator 354B. Output of first NAND logic operator 354A, second NAND logic operator 354B, third NAND logic operator 354C, and fourth NAND logic operator 354D is connected to input of third NOT logic operator 352C, fourth NOT logic operator 352D, fifth NOT logic operator 352E, and sixth NOT logic operator 352F, respectively. The output of third NOT logic operator 352C, fourth NOT logic operator 352D, fifth NOT logic operator 352E, and sixth NOT logic operator 352F provide the pre-decoded address lines XB<0>, XB<1>, XB<2>, and XB<3>, respectively.

Third address line A<2> is connected to input of seventh NOT logic operator 352G and the output of seventh NOT logic operator 352G is connected to the input of eighth NOT logic operator 352H. The output of seventh NOT logic operator 352G provides the pre-decoded address line XA<0> and pre-decoded booster address line XAB<1>. The output of eighth NOT logic operator 352H provides the pre-decoded address line XA<1> and the pre-decoded booster address line XAB<0>.

In example embodiments, it will be apparent to a person with ordinary skill in the art after reading this disclosure that pre-decoding circuit 350 is exemplary in nature, and other types and configuration of pre-decoding circuits may be used to pre-decode address lines of memory device 300. In addition, it will be apparent to a person with ordinary skill in the art after reading this disclosure that the address lines A<0>, A<1>, and A<2> can be pre-decoded into different pre-decoded address lines than the pre-decoded address lines XB<0>, XB<1>, XB<2>, XB<3>, XA<0>, XA<1>, XAB<0>, and XAB<1>.

Referring again to FIGS. 3A and 3B, cell array 302 is operated using the pre-decoded address lines. As shown in FIG. 3A, pre-decoded address lines XB<0>, XB<1>, XB<2>, XB<3>, XA<0>, and XA<1> are connected to the inputs of word line driver circuit 304 and pre-decoded booster address lines XAB<0> and XAB<1> are connected to the inputs of booster word line driver circuit 306. For example, XB<0>, XB<1>, XB<2>, XB<3>, XA<0>, and XA<1> are connected to the inputs of AND logic operators of word line driver circuit 304. The output from the AND logic operators are connected to input of a first set of NAND logic operators along with a system clock signal. The outputs from the first set of NAND logic operators are connected to the inputs of NOT logic operators. The outputs of the NOT logic operators are in turn connected to the word lines of cell array 302. In addition, pre-decoded address lines XB<0>, XB<1>, XB<2>, and XB<3> are connected to the inputs of a second set of NAND logic operators along with the system clock signal. The outputs from the second set of NAND logic operators are connected to booster word lines.

For example, pre-decoded address lines XB<0>, XB<1>, XB<2>, XB<3>, XA<0>, XA<1>, XAB<0>, and XAB<1> are used to select a word line and charge the selected word line of cell array 302. For example, when the potentials of each of the first address line A<0>, the second address line A<1>, and the third address line A<2> is logic high, then the potentials of each of the pre-decoded lines XA<1> and XB<3> is also logic high. For instance, referring to pre-decoding circuit 350 of FIG. 3B, when the potential of each of the second address line A<1> and the third address line A<2> is logic high, the potential at the output of fourth NAND logic operator 354D is logic low. Since the output of fourth NAND logic operator 354D, which is at logic low, is connected to the input of sixth NOT logic operator 352F, the potential at the output of sixth NOT logic operator 352F (that is, pre-decoded address line XB<3>) is also logic high. Similarly, when the potential of the first address line A<0> is logic high, then the potential at the output of seventh NOT logic operator 352G is logic low. Since the output of seventh NOT logic operator 352G, which is logic low, is connected to the input of eighth NOT logic operator 352H, the potential at the output of eighth NOT logic operator 352H (that is, the pre-decoded address line XA<1> and pre-decoded booster address line XAB<0>) is logic high. In addition, the potentials at the pre-decoded address lines XB<0>, XB<1>, XB<2>, and XA<0>, and the pre-decoded booster address line XAB<1> is logic low.

Moreover, when the potentials of pre-decoded lines XA<1> and XB<3> is logic high, word line WL<7> is selected and is charged to logic high. The selected word line WL<7> is charged to logic high from the first end as shown in FIG. 3A. In addition, when the potential of pre-decoded line XB<3> is logic high, then the associated booster word line WLB<3> is charged to logic low.

Furthermore, when the potential of the pre-decoded line XA<1> is high, the potential of pre-decoded booster address line XAB<1> is logic low. During operation, when the associated booster word line WLB<3> is charged to logic low and the pre-decoded booster word line XAB<1> is charged to logic low, the output of booster word line driver circuit 306 is logic high charging the selected word line WL<7> to logic high from the second end. Thus, in accordance with example embodiments, the selected word line WL<7> of cell array 302 is charged from both ends thereby improving cycle time of cell array 302 as compared to a conventional arrangement in which a selected word line is charged from only one end.

Similarly, when the word line WL<0> is selected, the pre-decoded address line XAB<0> is also selected and booster word line WLB<0> is activated, thereby charging the word line WL<0> from both the first end and the second end. Moreover, when the word line WL<1> is selected, the pre-decoded address line XAB<1> is also selected and the booster word line WLB<0> is activated, thus, charging the word line WL<1> from both the first end and the second end. Furthermore, when the word line WL<2> is selected, the pre-decoded address line XAB<0> is also selected and the booster word line WLB<1> is activated, thereby charging the word line WL<2> from both the first end and the second end. In addition, when the word line WL<3> is selected, the pre-decoded address line XAB<1> is also selected and the booster word line WLB<1> is activated, thus charging the word line WL<3> from both the first end and the second end. Similarly, when the word line WL<4> is selected, the pre-decoded address line XAB<0> is also selected and the booster word line WLB<2> is activated, hence, charging the word line WL<4> from both the first end and the second end. Moreover, when the word line WL<5> is selected, the pre-decoded address line XAB<1> is also selected and the booster word line WLB<2> is activated, thereby charging the word line WL<5> from both the first end and the second end. Lastly, when the word line WL<6> is selected, the pre-decoded address line XAB<0> is also selected and the booster word line WLB<3> is activated, thus, charging the word line WL<6> from both the first end and the second end.

Figure 4:
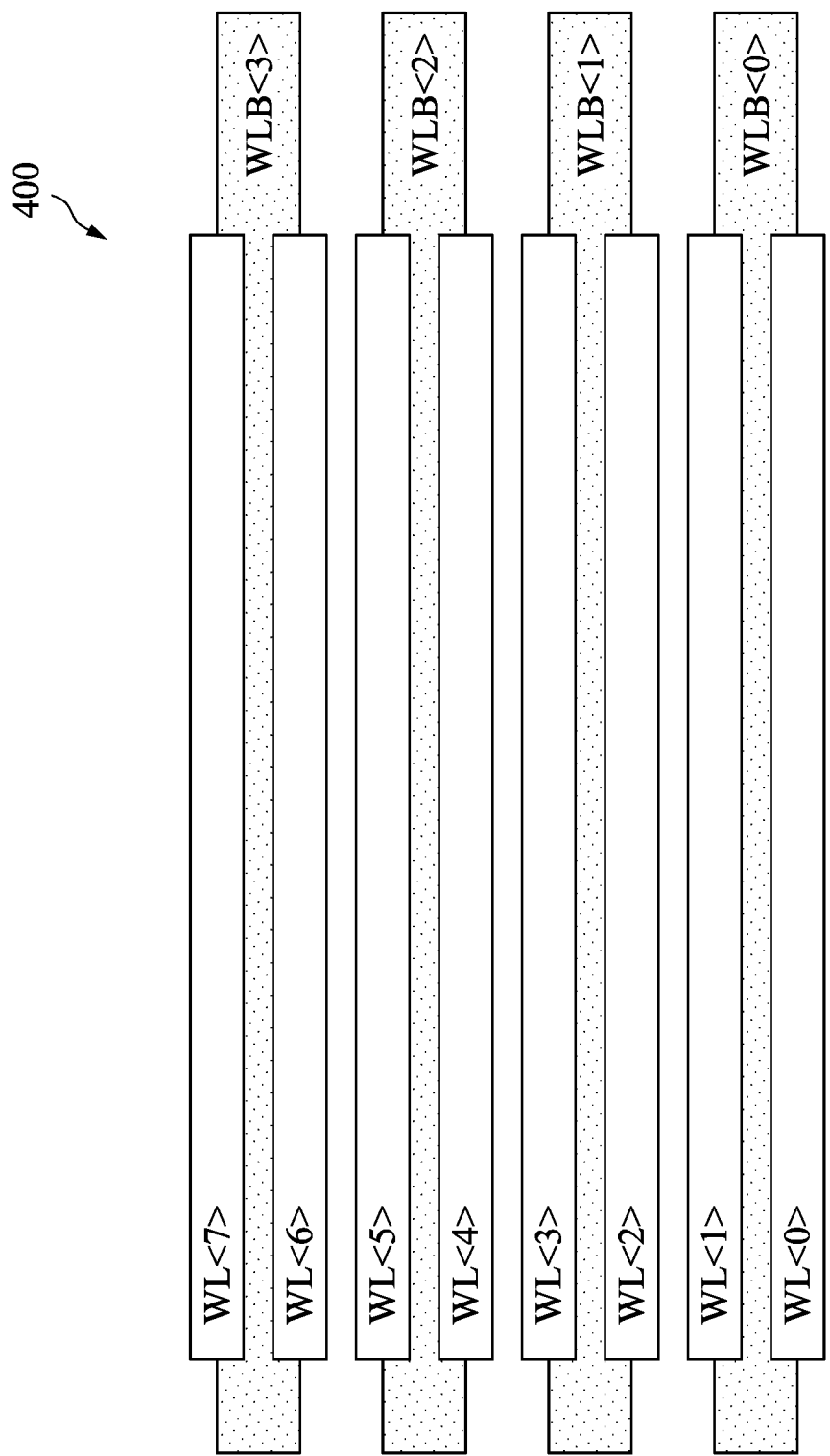
FIG. 4 illustrates an example layout of a cell array of the example first memory device, in accordance with some embodiments.

FIG. 4 illustrates an example layout of word lines and booster lines of cell array 302. The word lines and booster lines may be connected to one another, for example, by the structure of word line driver circuit 304 and booster word line driver circuit 306 shown in FIG. 3A. As shown in FIG. 4, each of word lines WL<0>, WL<1>, WL<2>, WL<3>, WL<4>, WL<5>, WL<6>, and WL<7> is formed as a strip having first length and a first width. In addition, the strip has a first thickness (not shown). Word lines WL<0>, WL<1>, WL<2>, WL<3>, WL<4>, WL<5>, WL<6>, and WL<7> are formed substantially parallel to each other separated by a dielectric material. The first length depends on a number of memory cells connected to each of the word lines. For example, the length of a word line increases with an increase in the number of memory cells to which it is connected. The word lines are formed from a first metal. For example, the metal can be metal layer 1.

As shown in FIG. 4, each of booster word lines WLB<0>, WLB<1>, WLB<2>, and WLB<3> is formed as a strip having a second length and a second width. In addition, the strip has a second thickness (not shown). Booster word lines WLB<0>, WLB<1>, WLB<2>, and WLB<3> are formed parallel to each other separated by a dielectric material. In example embodiments, the second width associated with the booster word lines is greater than the first width associated with the word lines. In addition, in some embodiments, the second thickness associated with the booster word lines is greater than the first thickness associated with the word lines. Hence, with the increased width and thickness, a resistance value of the booster word lines is less than the resistance value of the word lines.

In example embodiments, none of the memory cells of cell array 302 is directly connected to a booster word line. Instead, as shown in the embodiment of FIG. 3A, the booster word lines are connected to second ends of associated word lines, which in turn are connected to the memory cells of array 302. For example, booster word line WLB<3> shown in FIG. 3A extends from the word line driver circuit 304 to the booster word line circuit 306 where it connects to the second end (right side in FIG. 3A) of word line WL<7>. Therefore, dimensions of the booster word lines are not restricted by design constraints similar to those applied to word lines, since each word line of cell array 302 is designed to be connected to each memory cell of a row supported by the word line. The length and width required of each word line, therefore, is influenced by the number of memory cells present in the row to which the associated word line connects. However, the booster word line, by virtue of not being directly connected to any memory cells, can be designed to optimize a resistance value. The booster word lines facilitate charging associated word lines from a second end of the word line, rather than functioning to directly select memory cells. As such, the booster word lines are not directly connected to the memory cells. For example, the booster word lines can be designed to be thicker or wider than the word lines. The increased thickness and/or the increased width decreases the resistance value of the booster word lines. When the booster word lines are connected to the word lines, such as by word line driver circuit 304 and booster word line driver circuit 306 shown in FIG. 3A, the lower resistance booster word lines decrease a combined resistance value of the connected word lines and the booster word lines.

In example embodiments, the booster word lines are formed in a separate layer from the word line. For example, the booster word lines are formed in a layer above or below the word lines. The booster word lines are separated from the word lines by a dielectric material. Moreover, the booster word lines can be formed from a different metal than that of the word lines. For example, the booster word line can be formed from a second metal type and the word line can be formed from a first metal type, the second metal being different from the first metal.

Figure 5:
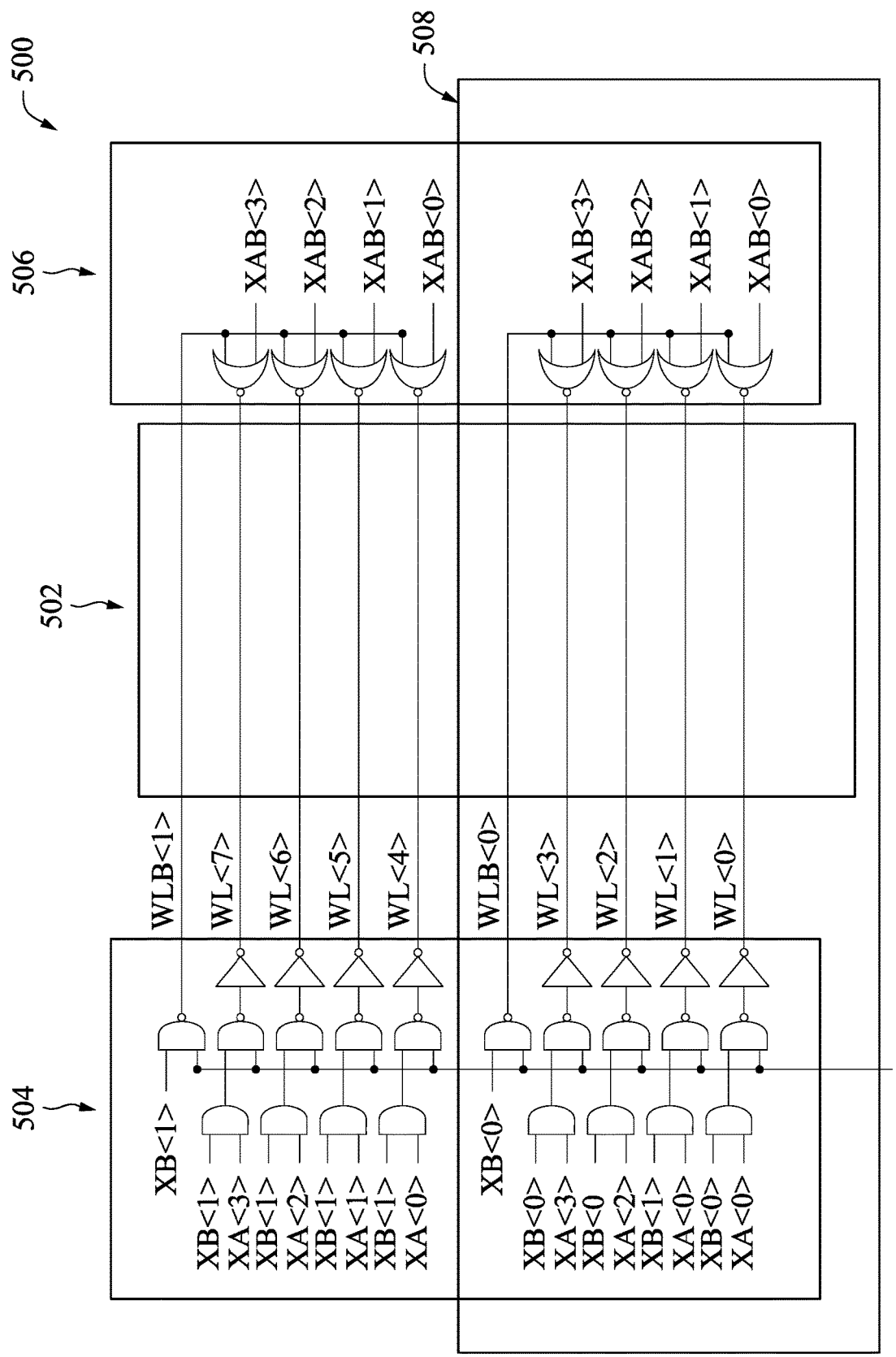
FIG. 5 illustrates a schematic diagram of an example second memory device, in accordance with some embodiments.

FIG. 5 illustrates an example second memory device 500 in accordance with embodiments of the disclosure. In example embodiments, second memory device 500 is an illustrative example of memory device 100 of FIG. 1 showing a 4:1 configuration in which four word lines are associated with one booster word line. Second memory device 500 includes cell array 502. Cell array 502 includes a plurality of word lines WL<0>, WL<1>, WL<2>, WL<3>, WL<4>, WL<5>, WL<6>, and WL7. Each of the plurality of word lines WL<0>, WL<1>, WL<2>, WL<3>, WL<4>, WL<5>, WL<6>, and WL<7> is connected to a plurality of memory cells (not shown). Although, cell array 502 is shown to include only eight word lines, it will be apparent to a person with the skill in the art after reading this disclosure that cell array 502 may include more than or less than eight word lines. In example embodiments, cell array 502 is an illustrative example of cell array 110 of FIG. 1 and FIG. 2 having eight word lines (that is m=8).

As shown in FIG. 5, cell array 502 further includes a plurality of booster word lines WLB<0> and WLB<1>. Each of the booster word lines is associated with a group of four word lines. For example, booster word line WLB<0> is associated with word lines WL<0>, WL<1>, WL<2>, and WL<3> and booster word line WLB<1> is associated with word lines WL<4>, WL<5>, WL<6> and WL<7>. As noted above, the configuration where one booster word line is associated with the group of four word lines is referred to as a 4:1 configuration. The combination of four word lines and associated one booster word line is designated as a unit block at 508. In example embodiments, unit block 508 can be replicated to expand the size of cell array 502.

Cell array 502 is accessed using word line driver circuit 504. For example, word line driver circuit 504 is operative to select a word line of cell array 502 and charge the selected word line to logic high. In addition, word line driver circuit 504 is operative to charge a booster word line associated with the selected word line to a pre-decoding address. Word line driver circuit 504 is operative to charge the selected word line and the associated booster word line from a first end.

Word line driver circuit 504 includes three address lines to operate cell array 502. Each of the three address lines is charged either to logic high or logic low, thereby providing eight unique selection options. Word line driver circuit 504 includes a plurality of logic operators to decode the potentials on the address line to select a word line of cell array 302. Word line driver circuit 504 is then operative to charge the selected word line to logic high from a first end.

Word line driver circuit 504 includes a decoder circuit comprising a plurality of logic operators to decode the potentials of the pre-decoded lines to identify a word line to charge. The plurality of logic operators include NOT logic operators and NAND logic operators. Although the decoder circuit of word line driver circuit 502 is shown to include NOT logic operators and NAND logic operators, it will be apparent to a person with ordinary skill in the art after reading this disclosure that kind of logic operators may be used to implement the decoder circuit of word line driver circuit 504. In example embodiments, word line driver circuit 504 is an illustrative example of word line driver circuit 120 of FIG. 1.

Second memory device 500 further includes a booster word line driver circuit 506. Booster word line driver circuit 506 is operative to decode the potentials of the booster word line associated with the selected word line and the pre-decoded booster address line. As shown in FIG. 5, outputs of booster word line driver circuit 506 are connected to a second end of the word lines of cell array 502. Booster word line driver circuit 506 is operative to decode the potentials of the booster word line associated with the selected word line and pre-decoded booster line, and charge the selected word line from the second end. For the 4:1 configuration, booster word line driver circuit 506 may use four booster decoding address lines (also referred to as the pre-decoded booster address lines) to charge the selected word line from the opposite end of the selected word line.

In example embodiments, booster word line driver circuit 506 includes a plurality of NOR logic operators to decode the potentials of the booster word line associated with the selected word line and pre-decoded booster address line. However, it will be apparent to a person with ordinary skill in the art after reading this disclosure that other type of logic operators may be used to implement the function of booster word line driver circuit 506. In example embodiments, booster word line driver circuit 506 is an illustrative example of booster word line driver circuit 160 of FIG. 1.

As shown in FIG. 5, cell array 502 is operated using the pre-decoded lines similarly to the example discussed in conjunction with FIG. 3A. For example, address lines A<0>, A<1>, and A<2> are pre-decoded into pre-decoded address lines XB<0>, XB<1>, XA<0>, XA<1>, XA<2>, and XA<3>, and pre-decoded booster address lines XAB<0>, XAB<1>, XAB<2>, and XAB<3>. Pre-decoded address lines XB<0>, XB<1>, XA<0>, XA<1>, XA<2>, XA<3> are used to select a word line and charge the selected word line from its first end, and the pre-decoded booster address lines XAB<0>, XAB<1>, XAB<2>, and XAB<3> are used to charge the selected word line from its second end. In example embodiments, in the 4:1 configuration, four pre-decoded address lines may be used to charge the word lines from the second end.

For example, when the word line WL<0> is selected, both the pre-decoded address line XAB<0> and the booster word line WLB<0> are activated, thereby charging the word line WL<0> from both the first end and the second end. Similarly, when the word line WL<1> is selected, both the pre-decoded address line XAB<1> and the booster word line WLB<0> are activated, hence, charging the word line WL<1> from both the first end and the second end. Moreover, when the word line WL<2> is selected, both the pre-decoded address line XAB<2> and the booster word line WLB<0> are activated, thereby charging the word line WL<2> from both the first end and the second end. Furthermore, when the word line WL<3> is selected, both the pre-decoded address line XAB<3> and the booster word line WLB<0> are activated, thus charging the word line WL<3> from both the first end and the second end. Similarly, when the word line WL<4> is selected, both the pre-decoded address line XAB<0> and the booster word line WLB<1> are activated, hence, charging the word line WL<4> from both the first end and the second end. Moreover, when the word line WL<5> is selected, both the pre-decoded address line XAB<1> and the booster word line WLB<1> are activated, thereby charging the word line WL<5> from both the first end and the second end. Furthermore, when the word line WL<6> is selected, both the pre-decoded address line XAB<2> and the booster word line WLB<1> are activated, thus, charging the word line WL<6> from both the first end and the second end. Lastly, when the word line WL<7> is selected, both the pre-decoded address line XAB<1> and the booster word line WLB<1> are activated, thus, charging the word line WL<7> from both the first end and the second end.

Figure 6:
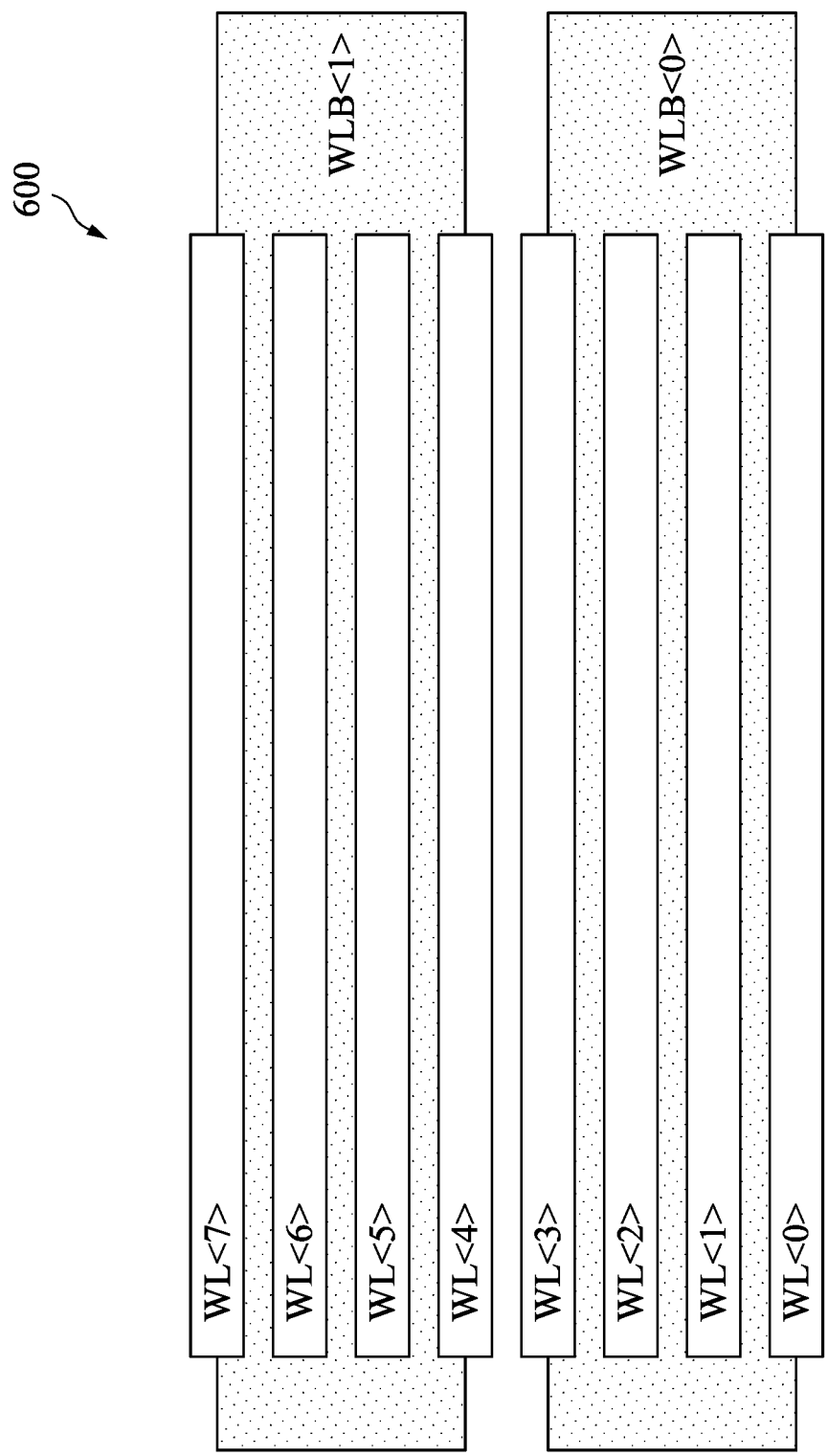
FIG. 6 illustrates an example layout of a cell array of the example second memory device, in accordance with some embodiments.

FIG. 6 illustrates an example layout of word lines and booster lines of cell array 502 for the 4:1 configuration. Each of word lines WL<O>, WL<1>, WL<2>, WL<3>, WL<4>, WL<5>, WL<6>, and WL<7> are formed as a strip having first length, a first width, and a first thickness. Word lines WL<O>, WL<1>, WL<2>, WL<3>, WL<4>, WL<5>, WL<6>, and WL<7> are formed generally parallel to each other separated by a dielectric material. The first length depends on a number of cells connected to each of the word lines. For example, the length of a word line increases with an increase in the number of memory cells to which it is connected. The word lines are formed from a first metal. For example, the first metal can be metal type 1

Each booster word line WLB<0> and WLB<1> of cell array 502 are formed as a strip having a second length, a second width, and a second thickness. Booster word lines WLB<0> and WLB<1> are formed generally parallel to each other separated by a dielectric material. In example embodiments, the second width is greater than the first width. In addition, in some embodiments, the second thickness is greater than the first thickness. Hence, resistance value of the booster word lines WLB<0 and WLB<1> is less than the resistance value of the word lines WL<0>, WL<1>, WL<2>, WL<3>, WL<4>, WL<5>, WL<6>, and WL<7>. Moreover, the second length, the second width, and the second thickness can be selected to obtain a desirable resistance value for the booster word lines WL<0>, WL<1>, WL<2>, WL<3>, WL<4>, WL<5>, WL<6>, and WL<7>.

In example embodiments, in cell array 502, the booster word lines WLB<0> and WLB1 are formed in a separate plane from the word lines WL<0>, WL<1>, WL<2>, WL<3>, WL<4>, WL<5>, WL<6>, and WL<7>. For example, the booster word lines are formed in a plane above or below a plane in which the word lines WL<0>, WL<1>, WL<2>, WL<3>, WL<4>, WL<5>, WL<6>, and WL<7> are formed. A dielectric material separates the two planes. In some embodiments, the booster word lines WLB<0> and WLB<1> are formed from a different metal type than that of the word lines WL<0>, WL<1>, WL<2>, WL<3>, WL<4>, WL<5>, WL<6>, and WL<7>. For example, the booster word lines WLB<0> and WLB<1> are formed in metal may 3 while the word lines WL<0>, WL<1>, WL<2>, WL<3>, WL<4>, WL<5>, WL<6>, and WL<7> are formed in metal layer 1.

Figure 7:
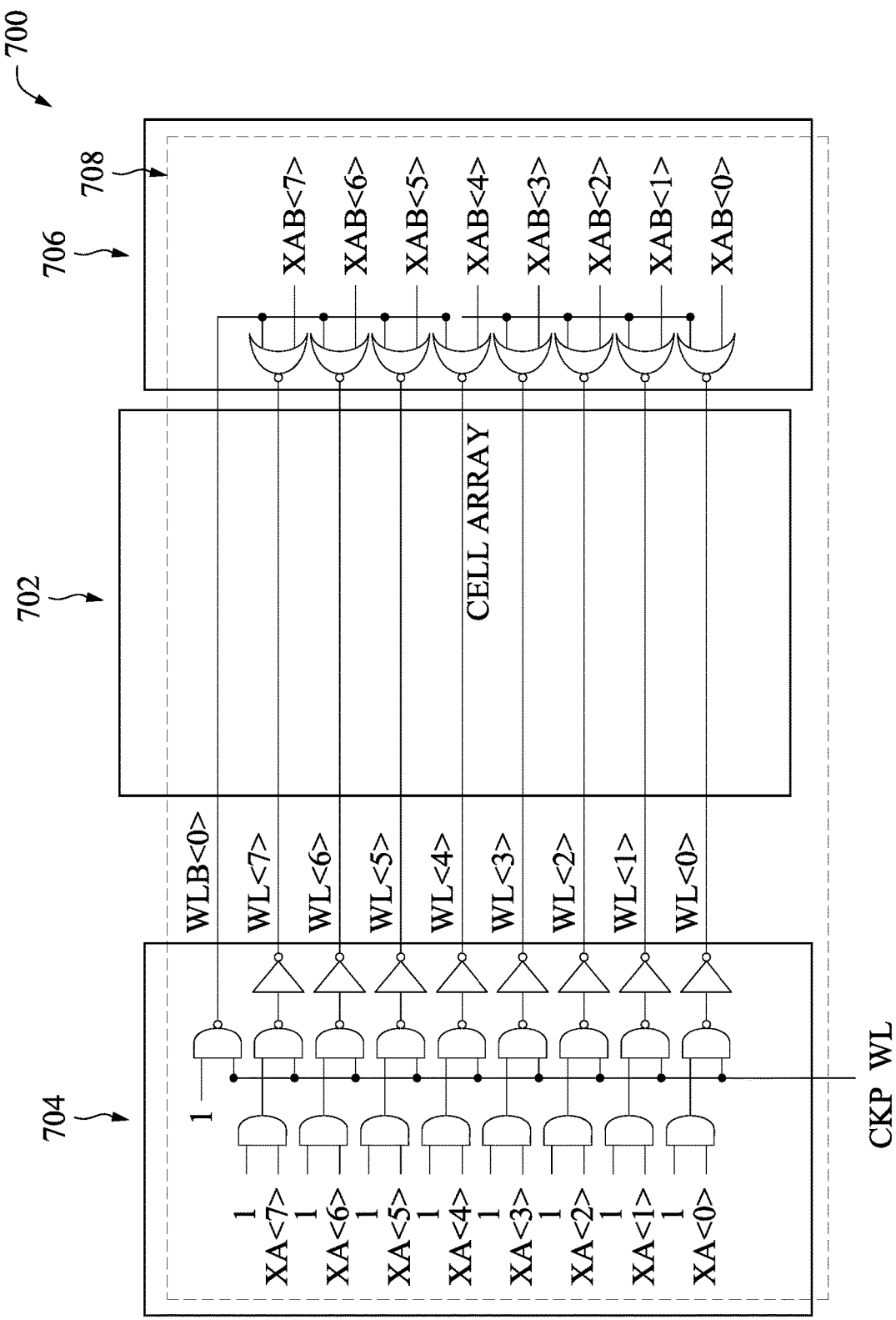
FIG. 7 illustrates a schematic diagram of an example third memory device, in accordance with some embodiments.

FIG. 7 illustrates an example third memory device 700 in accordance with further embodiments of the disclosure. In example embodiments, third memory device 700 is an illustrative example of memory device 100 of FIG. 1, showing an 8:1 configuration in which eight word lines are associated with one booster word line. Third memory device 700 includes cell array 702. Cell array 702 includes a plurality of word lines WL<0>, WL<1>, WL<2>, WL<3>, WL<4>, WL<5>, WL<6>, and WL<7>. Each of the plurality of word lines WL<0>, WL<1>, WL<2>, WL<3>, WL<4>, WL<5>, WL<6>, and WL<7> is connected to a plurality of memory cells (not shown). Although, cell array 702 is shown to include only eight word lines, it will be apparent to a person with the skill in the art after reading this disclosure that cell array 702 may include more than or less than eight word lines. In example embodiments, cell array 702 is an illustrative example of cell array 110 of FIG. 1 and FIG. 2 having eight word lines (that is m=8).

In addition, cell array 702 includes a booster word line WLB<0>. As shown in FIG. 7, booster word line WLB<0> is associated with a group of eight word lines WL<0>, WL<1>, WL<2>, WL<3>, WL<4>, WL<5>, WL<6>, and WL<7>. As noted above, the configuration where one booster word line is provided for group of eight word lines is referred to as an 8:1 configuration. The combination of eight word lines and associated one booster word line is referred to as a unit block for an 8:1 configuration. In example embodiments, the unit block can be replicated to expand the size of cell array 702.

Cell array 702 is accessed using word line driver circuit 704. For example, word line driver circuit 704 is operative to select a word line of cell array 702 and charge the selected word line to logic high. In addition, word line driver circuit 704 is operative to charge booster word line WLB<0> to a pre-decoding address. Word line driver circuit 704 is operative to charge the selected word line and the booster word line WLB<0> from a first end.

Word line driver circuit 704 includes three address lines to operate cell array 702. Each of the three address lines is charged either to logic high or logic low, thereby providing eight unique selection options. Word line driver circuit 704 includes a plurality of logic operators to decode the potentials on the address line to select a word line of cell array 702. For example, word line driver circuit 704 includes a decoder circuit comprising a plurality of logic operators to decode the potentials of the pre-decoded lines to identify a word line to charge. The plurality of logic operators include NOT logic operators and NAND logic operators. Although the decoder circuit of word line driver circuit 704 is shown to include NOT logic operators and NAND logic operators, it will be apparent to a person with ordinary skill in the art after reading this disclosure that kind of logic operators may be used to implement the decoder circuit of word line driver circuit 704. In example embodiments, word line driver circuit 704 is an illustrative example of word line driver circuit 120 of FIG. 1.

Third memory device 700 further includes a booster word line driver circuit 706. In example embodiments, booster word line driver circuit 706 is an illustrative example of booster word line driver circuit 160 of FIG. 1. Booster word line driver circuit 706 is operative to decode the potentials of the booster word line WLB<0> and the booster address line. As shown in FIG. 7, outputs of booster word line driver circuit 706 is connected to a second end of the word lines WL<0>, WL<1>, WL<2>, WL<3>, WL<4>, WL<5>, WL<6>, and WL<7>. Booster word line driver circuit 706 is operative to decode the potentials of the booster word line associated with the selected word line and pre-decoded booster line, and charge the selected word line from the second end. For the 8:1 configuration, booster word line driver circuit 706 may use eight booster decoding address lines (also referred to as the pre-decoded booster address lines) to charge the selected word line from the opposite end of the selected word line.

In example embodiments, booster word line driver circuit 706 includes a plurality of NOR logic operators to decode the potential of the booster word line associated with the selected word line and pre-decoded booster line. However, it will be apparent to a person with ordinary skill in the art after reading this disclosure that other type of logic operators may be used to implement the function of booster word line driver circuit 706.

As shown in FIG. 7, cell array 702 is operated using the pre-decoded lines similarly to the examples discussed in conjunction with FIGS. 3A and 5. For example, address lines A<0>, A<1>, and A<2> are pre-decoded into pre-decoded address lines XA<0>, XA<1>, XA<2>, XA<3>, XA<4>, XA<5>, XA<6>, and XA<7>, pre-decoded booster address lines XAB<0>, XAB<1>, XAB<2>, XAB<3>, XAB<4>, XAB<5> XAB<6>, and XAB<7>. The pre-decoded lines XA<0>, XA<1>, XA<2>, XA<3>, XA<4>, XA<5>, XA<6>, and XA<7>, and the pre-decoded booster word lines XAB<0>, XAB<1>, XAB<2>, XAB<3>, XAB<4>, XAB<5> XAB<6>, and XAB<7> are used to select a word line and charge the selected word line from both ends. In example embodiments, in the 8:1 configuration, eight pre-deciding address lines may be used to charge the word lines from the second end.

For example, when the word line WL<0> is selected, both the pre-decoded address line XAB<0> and the booster word line WLB<0> are activated, thereby charging the word line WL<0> from both the first end and the second end. Similarly, when the word line WL<1> is selected, the pre-decoded address line XAB<1> and the booster word line WLB<0> are both activated, hence, charging the word line WL<1> from both the first end and the second end. Moreover, when the word line WL<2> is selected, the pre-decoded address line XAB<2> and the booster word line WLB<0> both are both activated, thereby charging the word line WL<2> from both the first end and the second end. Furthermore, when the word line WL<3> is selected, both the pre-decoded address line XAB<3> and the booster word line WLB<0> are activated, thus charging the word line WL<3> from both the first end and the second end. Similarly, when the word line WL<4> is selected, the pre-decoded address line XAB<4> and the booster word line WLB<1> are both activated, hence, charging the word line WL<4> from both the first end and the second end. Moreover, when the word line WL<5> is selected, the pre-decoded address line XAB<5> and the booster word line WLB<1> are both activated, thereby charging the word line WL<5> from both the first end and the second end. Furthermore, when the word line WL<6> is selected, both the pre-decoded address line XAB<6> and the booster word line WLB<1> are activated, thus, charging the word line WL<6> from both the first end and the second end. Lastly, when the word line WL<7> is selected, both the pre-decoded address line XAB<7> and the booster word line WLB<1> are activated, thus, charging the word line WL<7> from both the first end and the second end.

Figure 8:
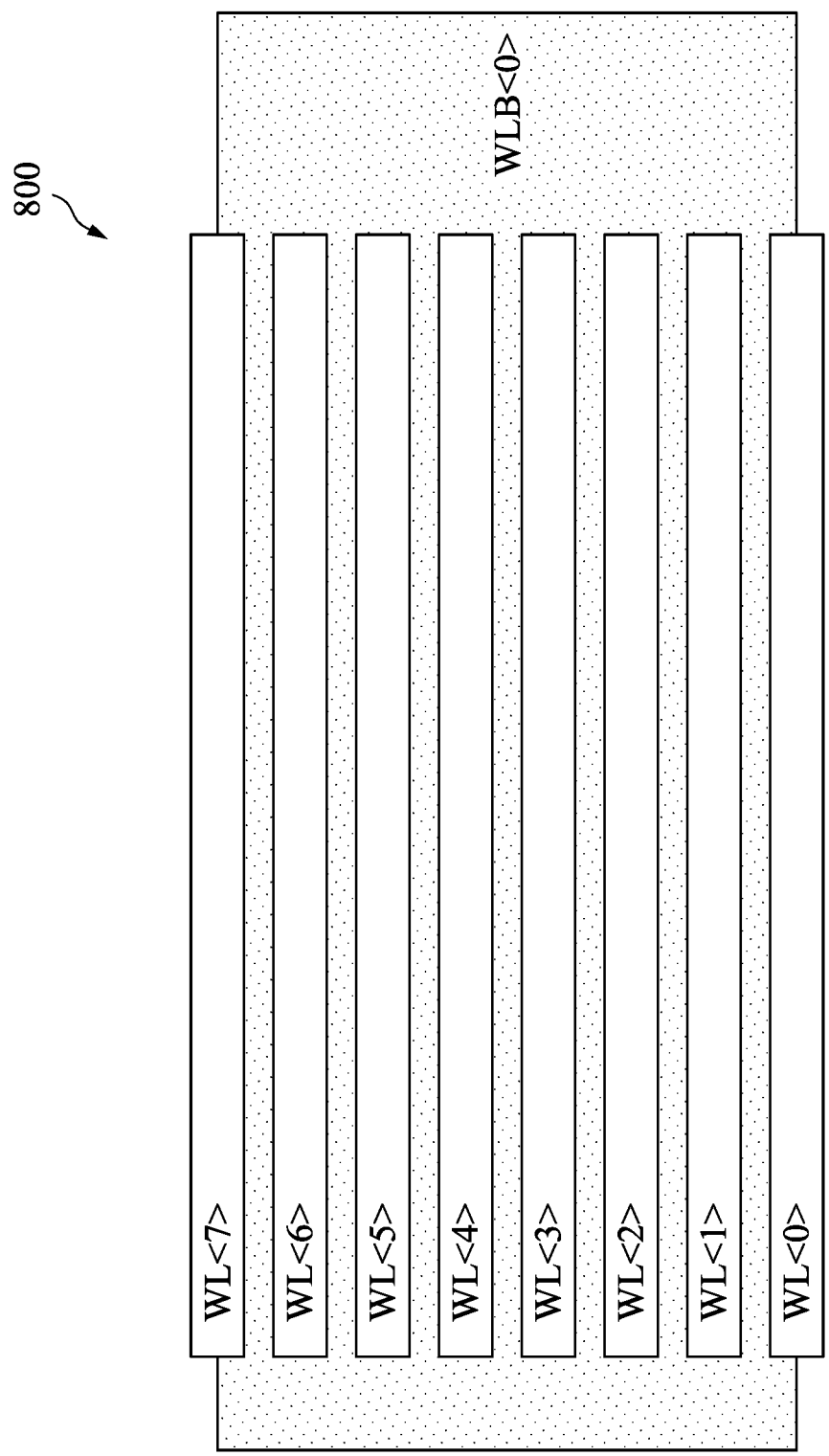
FIG. 8 illustrates an example layout of a cell array of the example third memory device, in accordance with some embodiments.

FIG. 8 illustrates an example layout of word lines and booster lines of cell array 702 for the 8:1 configuration. Each word line WL<0>, WL<1>, WL<2>, WL<3>, WL<4>, WL<5>, WL<6>, and WL<7> is formed as a strip having first length, a first width, and a first thickness. Word lines WL<0>, WL<1>, WL<2>, WL<3>, WL<4>, WL<5>, WL<6>, and WL<7> are formed generally parallel to each other separated by a dielectric material. The first length depends on a number of memory cells connected to each of the word lines. For example, the length of a word line increases with an increase in number of memory cells connected to it. The word lines are formed from a first metal. For example, the first metal can be metal type 1.

As shown in FIG. 8, booster word line WLB<0> is formed as a strip having a second length, a second width, and a second thickness. In example embodiments, the second width is greater than the first width. In addition, the second thickness is greater than the first thickness. Hence, the resistance value of booster word line WLB<0> is less than that of the word lines WL<0>, WL<1>, WL<2>, WL<3>, WL<4>, WL<5>, WL<6>, and WL<7>.

Comparing the 2:1, 4:1, and 8:1 configurations shown in FIGS. 4, 6, and 8, respectively, the booster word lines of the 2:1 and 4:1 configurations of FIGS. 4 and 6 are thinner than the booster word line of the 8:1 configuration shown in FIG. 8. The thicker booster word lines will typically have a lower resistance than a thinner word line, and thus provide better (i.e. faster) performance. However, the 2:1 configuration uses a two bit address, and thus has two decoding lines. Thus, as shown in the example of FIG. 3A, the booster word line driver circuit 306 receives only two bit address (XAB<0:1> for each booster word line. In contrast, booster word line drive circuit 706 for the 8:1 configuration shown in FIG. 7 uses an eight bit address. As such, booster word line drive circuit 706 requires eight decoding lines (XAB<0:7). Therefore, while the thinner booster word lines of the 2:1 configuration may exhibit a higher resistance than the thicker booster word line of the 8:1 configuration, the 2:1 configuration may use a simpler decoding structure, while the faster (i.e. thicker) booster word line of the 8:1 configuration may use a more complex decoding structure. The particular word line/booster word line configuration may thus be selected based on design requirements for speed vs. complexity, for example.

In example embodiments, the booster word line is formed in a separate plane from the word line. For example, the booster word line WLB<0> is formed in a second plane which is above or below a first plane in which the word lines WL<0>, WL<1>, WL<2>, WL<3>, WL<4>, WL<5>, WL<6>, and WL<7> are formed. The second plane and the first place are separated by a dielectric material. Moreover, the booster word line WLB<0> is formed from different metal than the word lines WL<0>, WL<1>, WL<2>, WL<3>, WL<4>, WL<5>, WL<6>, and WL<7>. For example, WLB0 is formed from type 2 metal while the word lines WL<0>, WL<1>, WL<2>, WL<3>, WL<4>, WL<5>, WL<6>, and WL<7> are formed from a metal type 1.

Figure 9:
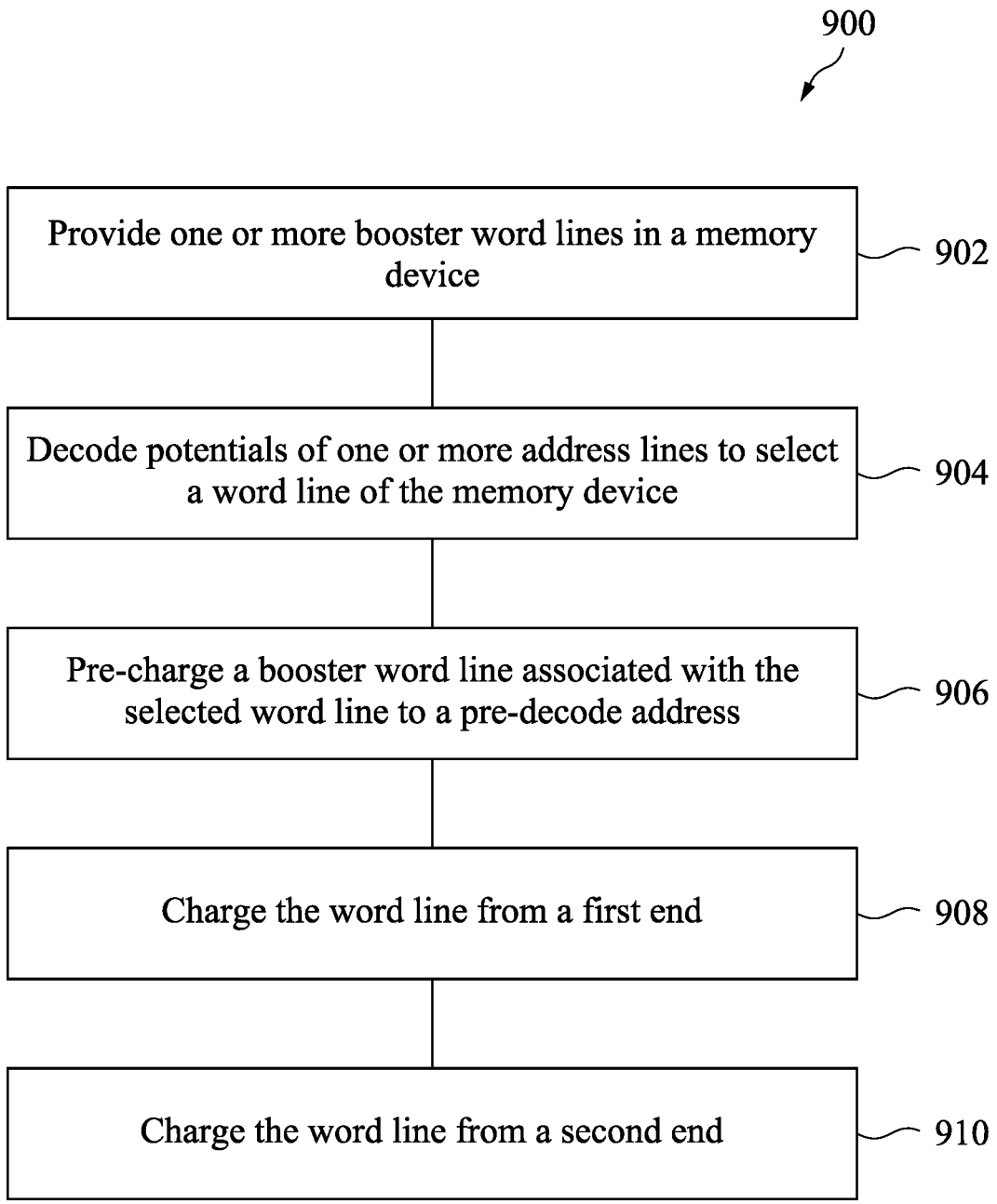
FIG. 9 illustrates an example method for operating a booster word line in connection with a memory device, in accordance with some embodiments.

FIG. 9 illustrates steps of a method 900 for operating a memory device. The steps of method 900 may be executed to operate memory devices discussed with reference to FIGS. 1, 3A, 5, and 7 of the specification. In an example embodiment, the steps of method 900 may be performed using logic devices and formed elements. However, the steps of method 900 can also be performed using a processor and a memory. The steps of method 900 are stored as instructions on the memory which when executed by the processor configures the processor to perform the steps of method 900.

At block 902 of method 900, one or more booster word lines are provided in a memory device. For example, one or more booster word lines may be formed in a memory device. A number of the booster word lines depends on a chosen configuration. For example, for a 1:1 configuration, one booster line is provided for every word line of the memory device. Similarly, for a 2:1 configuration, one booster line is provided for every two word lines of the memory device. In addition, for a 3:1 configuration, one booster line is provided for every three word lines of the memory device, and so on.

At block 904 of method 900, potentials of one or more address lines are decoded to select a word line of the memory device. The potentials of the address lines are decoded using a decoding circuit which includes a plurality of logic operators. It will be appreciated, however, that the decoding may also be performed by a processor using a logic table. The potentials are represented in binary numbers. For example, binary digit 1 represents a first potential and binary digit 0 represents a second potential. The first potential is different from the second potential.

At block 906, a booster line associated with the selected word line is pre-charged to a pre-decoding address. For example, a word line driver circuit is operative to charge the booster word line to a second potential from a first end. At block 908 of method 900, the selected word line is charged from a first end. For example, the word line driver circuit is operative to charge the word line to a first potential from a first end. At block 910 of method 900, the selected word line is charged from a second end. For example, a booster word line driver circuit is operative to charge the word line to the first potential from a second end.

Figure 10:
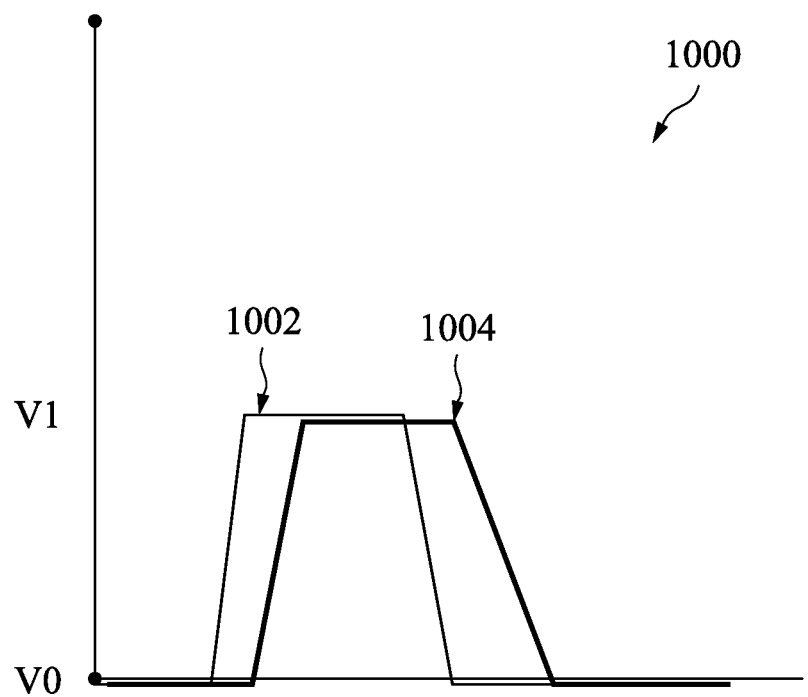
FIG. 10 illustrates example voltage profiles of a word line of an example memory device, in accordance with some embodiments.

Hence, in accordance with example embodiments, the selected word line is charged to the first potential from both the first end and the second end. Charging of the selected word line from both ends results in improved potential profile at both ends of the selected word line. For example, FIG. 10 illustrates an example voltage profile at two ends of a selected word line of an example memory device 100. Plot 1002 of FIG. 10 illustrates a voltage profile at a first end of the selected word line and plot 1004 of FIG. 10 illustrates a voltage profile at a second end of selected word line. The voltage V1 represents the first potential and voltage V0 represents the second potential. As shown in FIG. 10, the voltage profiles are substantially similar at both ends of the selected word line. This improves a cycle time of memory device 100 since the word line charging signal is applied to both ends of the selected word line, rather than requiring a single charging signal to travel from one end of the selected word line to the opposite end of the selected word line. For example, the improved voltage profile improves a time gap between providing an input and receiving a corresponding output from memory device 300. As a result, charging the selected word line from both ends improves operating speed of memory device 100.

In accordance with example embodiments a semiconductor device comprises a plurality of memory cells arranged in rows and columns; a plurality of primary word lines, wherein each of the plurality of primary word lines is connected to a first plurality of memory cells arranged in a row; a word line driver circuit operative to select a first primary word line of the plurality of primary word lines and charge the selected first primary word line from a first end; and at least one secondary word line operative to charge the selected first primary word line from a second end.

In accordance with example embodiments a memory device comprises a plurality of memory cells arranged in a matrix of rows and columns; a plurality of word lines, each of the plurality of word lines connected to a first plurality of memory cells of a row of the matrix; a plurality of booster word lines, wherein each of the plurality of booster word lines is associated with a predetermined number of word lines; and a driver circuit operative to: decode potentials at a plurality of address lines to select one of the plurality of word lines, charge the selected one of the plurality of word line from a first end, and charge the selected one of the plurality of word lines from a second end via one of the plurality of booster word lines associated with the selected one of the plurality of word lines.

In accordance with example embodiments a method for operating a memory device comprises providing at least one booster word line in a cell array of the memory device, the cell array comprising a plurality of word lines connected to a plurality of memory cells arranged in rows; decoding potentials of address lines to select a word line of the plurality of word lines of the cell array; charging the selected word line approximately equal to a first predetermined potential from a first end; and charging the selected word line from a second end via the at least one booster word line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a plurality of memory cells arranged in rows and columns;
a plurality of primary word lines, wherein each of the plurality of primary word lines is connected to a first plurality of memory cells arranged in a row;
a word line driver circuit operative to select a first primary word line of the plurality of primary word lines and charge the selected first primary word line from a first end; and
at least one secondary word line connected to the first primary word line, wherein the at least one secondary word line is operative to charge the selected first primary word line from a second end, and wherein the first primary word line is formed on a first layer and the at least one secondary word line is formed in a different layer than the first layer.

2. The semiconductor device of claim 1, wherein a combined resistance of the first primary word line and the secondary word line is less than a resistance of the first primary word line.

3. The semiconductor device of claim 1, wherein the word line driver circuit is operative to charge the at least one secondary word line substantially equal to a second predetermined potential, and wherein the second predetermined potential is substantially equal to a pre-decoded address line potential.

4. The semiconductor device of claim 1, wherein the plurality of primary word line are formed of a first metal and the at least one secondary word line is formed of a different metal than the first metal.

5. The semiconductor device of claim 1, wherein the word line driver circuit is operative to select the first primary word line from the plurality of primary word lines by decoding potentials at a plurality of address lines.

6. The semiconductor device of claim 1, wherein each of the at least one secondary word line is associated with a predetermined number of the primary word lines.

7. The semiconductor device of claim 6, wherein the predetermined number of primary word lines associated with each of the at least one secondary word line comprises $2^n$ primary word lines, where n is a positive integer.

8. A memory device comprising:
a plurality of memory cells arranged in a matrix of rows and columns;
a plurality of word lines, each of the plurality of word lines connected to a first plurality of memory cells of a row of the matrix;
a plurality of booster word lines, wherein each of the plurality of booster word lines is connected to a predetermined number of word lines of the plurality of word lines; and
a driver circuit operative to:
decode potentials at a plurality of address lines to select one of the plurality of word lines,
charge the selected one of the plurality of word line from a first end, and
charge the selected one of the plurality of word lines from a second end via one of the plurality of booster word lines associated with the selected one of the plurality of word lines, wherein the selected one of the plurality of word lines is formed on a first layer and the one of the plurality of booster word lines is formed in a different layer than the first layer.

9. The memory device of claim 8, wherein the each of the plurality of word lines are formed as a strip comprising a first width.

10. The memory device of claim 9, wherein the each of the plurality of booster word lines are formed as another strip comprising a second width.

11. The memory device of claim 10, wherein the second width is greater than the first width.

12. The memory device of claim 8, wherein a resistance value of the one of the plurality of booster word lines is less than the resistance value of the selected one of the plurality of word lines.

13. The memory device of claim 8, wherein the plurality of word lines are formed in a first plane of a semiconductor and the plurality of booster word lines are formed in a second plane of the semiconductor different from the first plane.

14. The memory device of claim 8, wherein the plurality of word lines are formed from a first metal and the plurality of booster word lines are formed from a second metal different from the first metal.

15. The memory device of claim 8, wherein the driver circuit is further operative to:
charge the selected one of the plurality of word lines substantially equal to a first predetermined potential from the first end;

charge the one of the plurality of booster word lines substantially equal to a second predetermined potential from the first end; and charge the selected one of the plurality of word lines from the second end substantially equal to the first predetermined potential.

16. The memory device of claim 8, further comprising a pre-decoding circuit operative to pre-decode the address lines to pre-decoded address lines and pre-decoded booster address lines.

17. The memory device of claim 8, wherein the plurality of word lines are formed on a first layer and the plurality of booster word lines are formed in a different layer than the first layer.

18. A method comprising:

providing at least one booster word line in a cell array of the memory device, the cell array comprising a plurality of word lines connected to a plurality of memory cells arranged in rows;

decoding potentials of address lines to select a word line of the plurality of word lines of the cell array;

charging the selected word line approximately equal to a first predetermined potential from a first end; and charging the selected word line from a second end via the at least one booster word line, wherein the at least one booster word line is connected to the selected word line, and wherein the first primary word line is formed on a first layer and the at least one secondary word line is formed in a different layer than the first layer.

19. The method of claim 18, wherein charging the selected word line from the second end via the at least one booster word line comprises:

charging the at least one booster word line substantially equal to a second predetermined potential;

decoding potentials at the address lines and the second predetermined potential; and charging the selected word line from the second end.

20. The method of claim 18, wherein the each of the plurality of word lines are formed as a strip comprising a first width, and wherein the each of the at least one booster word line is formed as another strip comprising a second width.

* * * * *